United States Patent
Chang et al.

(10) Patent No.: US 10,923,792 B2
(45) Date of Patent: Feb. 16, 2021

(54) MICROWAVE FEEDING MODULE AND CIRCUIT BOARD STRUCTURE

(71) Applicant: MICROELECTRONICS TECHNOLOGY, INC., Hsinchu (TW)

(72) Inventors: Kuo-Tien Chang, Hsinchu (TW); Yen-Fen Lin, Hsinchu (TW); Hung-Yu Lei, Hsinchu (TW)

(73) Assignee: MICROELECTRONICS TECHNOLOGY, INC., Hsinchu (TW)

( * ) Notice: Subject to any disclaimer, the term of this patent is extended or adjusted under 35 U.S.C. 154(b) by 18 days.

(21) Appl. No.: 16/363,133

(22) Filed: Mar. 25, 2019

(65) Prior Publication Data

US 2020/0313268 A1 Oct. 1, 2020

(51) Int. Cl.
| | |
|---|---|
| *H01P 3/12* | (2006.01) |
| *H05K 1/11* | (2006.01) |
| *H05K 1/02* | (2006.01) |
| *H01Q 1/50* | (2006.01) |
| *H05K 1/03* | (2006.01) |

(52) U.S. Cl.
CPC ............... *H01P 3/12* (2013.01); *H01Q 1/50* (2013.01); *H05K 1/024* (2013.01); *H05K 1/115* (2013.01); *H05K 1/119* (2013.01); *H05K 1/0353* (2013.01); *H05K 2201/012* (2013.01); *H05K 2201/093* (2013.01); *H05K 2201/09063* (2013.01); *H05K 2201/09609* (2013.01)

(58) Field of Classification Search
CPC ......... H01P 1/161; H05K 1/115; H05K 1/119; H05K 1/0353; H05K 2201/012; H05K 2201/09063; H05K 2201/093; H05K 2201/09609

USPC .......................................................... 333/239
See application file for complete search history.

(56) References Cited

U.S. PATENT DOCUMENTS

| | | | | |
|---|---|---|---|---|
| 5,471,664 A | * | 11/1995 | Kim ........................ | H01P 1/16 333/21 A |
| 5,724,049 A | * | 3/1998 | Park ....................... | H01P 5/107 333/26 |
| 6,426,729 B2 | * | 7/2002 | Yoshida ................. | H01P 1/161 333/21 A |

(Continued)

FOREIGN PATENT DOCUMENTS

EP 0482456 A1 * 4/1992 ............. H01P 1/161

*Primary Examiner* — Robert J Pascal
*Assistant Examiner* — Kimberly E Glenn
(74) *Attorney, Agent, or Firm* — Muncy, Geissler, Olds & Lowe, P.C.

(57) ABSTRACT

The present disclosure relates to a satellite signal feeding module and circuit board structure. The circuit board includes a dielectric substrate, a plurality of grounding sheets, a plurality of top feed sheets, a plurality of bottom feed sheets, and a conductive layer. The dielectric substrate includes a main segment having an opening, a rib segment extending across a full width of the opening, and a plurality of extending segments connected to the main segment. The grounding sheets cover the rib segment and a majority portion of the main segment. The top feeding sheets and the bottom sheets cover the extending segments. The conductive layer is disposed in first holes disposed in the main segment and the rib segment for electrically coupling the grounding sheets. The conductive layer is further disposed in second holes in the extending segments for electrically coupling the top and bottom feeding sheets.

20 Claims, 11 Drawing Sheets

(56) References Cited

U.S. PATENT DOCUMENTS

| | | |
|---|---|---|
| 6,445,260 B1 | 9/2002 | Miyazaki et al. |
| 8,138,850 B2 * | 3/2012 | Huang ................... H01P 5/107 333/21 A |
| 2012/0188030 A1 | 7/2012 | Liu et al. |

* cited by examiner

MICROWAVE FEEDING MODULE AND CIRCUIT BOARD STRUCTURE

TECHNICAL FIELD

The present disclosure relates to a feeding module and a circuit board structure thereof, and more particularly, to a satellite signal feeding module and circuit board structure thereof.

DISCUSSION OF THE BACKGROUND

The use of satellite antennas for reception of television transmission from satellites has increased rapidly in recent years. The use of satellite antennas allows households to have access to hundreds of television channels, which is usually many more than are available through local cable television systems.

Conventionally, satellite signals transmitted by the satellite are received by a satellite antenna and processed by a particular device, such as low-noise block converter, prior to application to a conventional home television. It is common knowledge that minimizing an insertion loss of the satellite antenna can be achieved by using a printed circuit board with a low dielectric loss (also called "loss tangent" or "dissipation factor"), e.g., a printed circuit board having a dielectric loss not greater than 0.002. However, the printed circuit board having the low dielectric loss is expensive and is not well-suited for integration with the satellite antenna and a back-stage signal-processing circuit.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a circuit board structure. The circuit board structure includes a dielectric substrate, a plurality of grounding sheets, a plurality of top feeding sheets, a plurality of bottom feeding sheets, and a conductive layer. The dielectric substrate includes a main segment having an opening, a rib segment extending across a full width of the opening, and a plurality of extending segments extending inward from the main segment. A first gap is disposed between the rib segment and each of the extending segments. The grounding sheets are disposed on a top surface of the dielectric substrate and a bottom surface opposite to the top surface, and cover the rib segment and a majority portion of the main segment. The top feeding sheets are placed on the top surface and cover the extending segments. The bottom feeding sheets are placed on the bottom surface and cover the extending segment. The top feeding sheets and the bottom feeding sheets are electrically isolated from the grounding sheets. The conductive layer is disposed in a plurality of first holes, disposed in the main segment and the rib segment, for electrically coupling the grounding sheets, and the conductive layer is further disposed in a plurality of second holes disposed in the extending segments, and configured for electrically coupling the top feeding sheets to the bottom feeding sheets.

In some embodiments, extending centerlines of the first extending segment and the second extending segment are respectively perpendicular to the rib segment.

In some embodiments, a distance between two adjacent first holes is substantially greater than a distance between two adjacent second holes.

In some embodiments, each of the grounding sheets includes a central portion placed on the rib segment, and a plurality of peripheral portions placed on the main segment and spaced away from the central portion.

In some embodiments, a distance between two peripheral portions gradually decreases at positions of increasing distance from the central portion.

In some embodiments, the circuit board structure further includes a plurality of lead-out sheets connected to the top feeding sheets and the bottom feeding sheets and placed on the main segment where the peripheral portions are not placed.

In some embodiments, each of the peripheral portions has a curving inner edge and a straight outer edge.

In some embodiments, the circuit board structure further comprises a plurality of metal sheets disposed in the dielectric substrate and electrically connected to the feeding sheets through the conductive layer disposed in the second holes.

In some embodiments, a dielectric loss of the dielectric substrate is greater than 0.01.

In some embodiments, a diameter of each of the first holes is greater than that of each of the second holes.

Another aspect of the present disclosure provides a microwave feeding module. The microwave feeding module includes a cover, a waveguide, a circuit board structure between the cover and the waveguide, and a septum polarizer fixed in the waveguide. The circuit board structure includes a dielectric substrate, a plurality of grounding sheets, a plurality of top feeding sheets, a plurality of bottom feeding sheets, and a conductive layer. The dielectric substrate includes a main segment having an opening, a rib segment extending across a full width of the opening, and a plurality of extending segments extending inward from the main segment, wherein a first gap is disposed between the rib segment and each of the extending segments. The grounding sheets are placed on a top surface of the dielectric substrate and a bottom surface opposite to the top surface, and cover the rib segment and a majority portion of the main segment. The cover is in contact with the grounding sheet placed on the top surface, and the waveguide is in contact with the grounding sheet placed on the bottom surface. The top feeding sheets are placed on the top surface and cover the extending segments. The bottom feeding sheets are placed on the bottom surface and cover the extending segments. The top feeding sheets and the bottom feeding sheets are electrically isolated from the grounding sheets. The conductive layer is disposed in a plurality of first holes, disposed in the main segment and the rib segment, for electrically coupling the grounding sheets, and in a plurality of second holes, disposed in the extending segments, for electrically coupling the top feeding sheets to the bottom feeding sheets. The septum polarizer is in contact with the grounding sheet placed on the bottom surface.

In some embodiments, the cover comprises a plate, an annular wall disposed on the peripheral portion of the plate, and a rib extending from the plate and connected to the annular wall; wherein the annular wall and the rib are in contact with one of the grounding sheets, and the waveguide and the septum polarizer are in contact with the other one of the grounding sheets.

In some embodiments, the cover further comprises a plurality of notches extending from an outer circumferential surface to an inner circumferential surface of the annular wall.

In some embodiments, the cover further comprises a plurality of flanges protruding from the outer circumferential surface such that each of the notches is surrounded by one of the flanges.

In some embodiments, the waveguide further includes a plurality of protrusions extending outward from an outer circumferential surface of the waveguide, and the protrusions are disposed corresponding to the notches.

In some embodiments, the protrusions are in contact with one of the grounding sheets placed on the bottom surface.

In some embodiments, the circuit board structure further comprises a plurality of lead-out sheets connected to the top feeding sheets and the bottom feeding sheets and placed on the main segment where the peripheral portions are not placed, and the lead-out sheets are disposed in the notches.

In some embodiments, a plurality of curved portions are bent outwardly from the waveguide, and the curved portions are disposed corresponding to the notches.

In some embodiments, the septum polarizer divides an interior of the waveguide in half.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
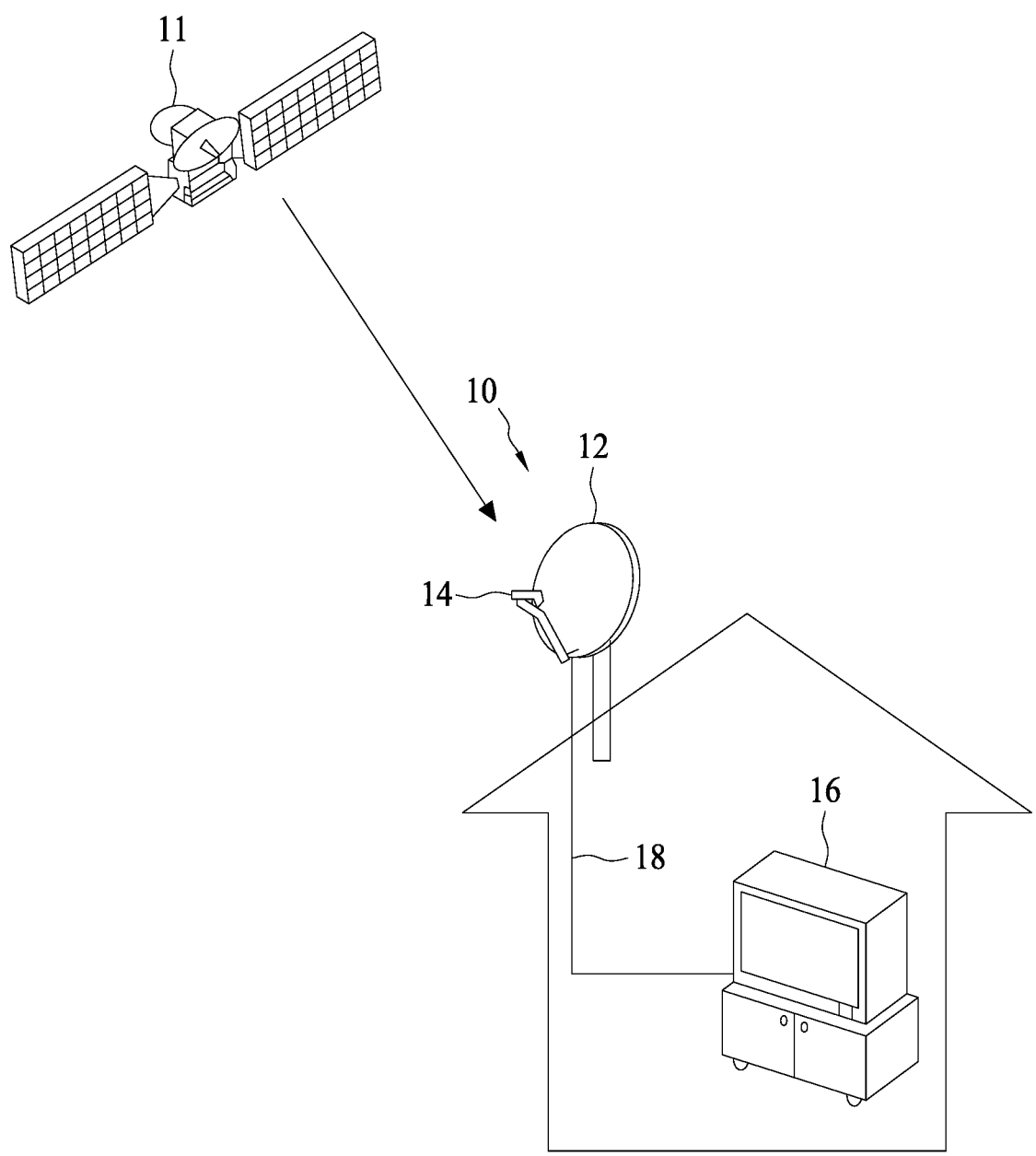
FIG. 1 is a schematic diagram illustrating a satellite broadcast reception system in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram illustrating a satellite broadcast reception system 10 in accordance with some embodiments of the present disclosure. Referring to FIG. 1, the satellite broadcast reception system 10 is configured to receive microwave signals broadcast by a satellite 11. In some embodiments, the satellite broadcast reception system 10 includes a dish reflector 12 and a low noise block (LNB) downconverter 14 disposed at the focus of the dish reflector 12; the microwave signals are collected by the dish reflector 12 and focused or concentrated into the LNB downconverter 14. In some embodiments, the LNB downconverter 14 amplifies the low noise of the microwave signals and converts the frequency of the microwave signals down to a low noise intermediate frequency (IF) signal having an adequate level, and the low noise IF signal output from the LNB downconverter 14 is sent to at least one receiver 16, such as a television, through a coaxial cable 18, thereby providing a satellite television program to users.

Figure 2:
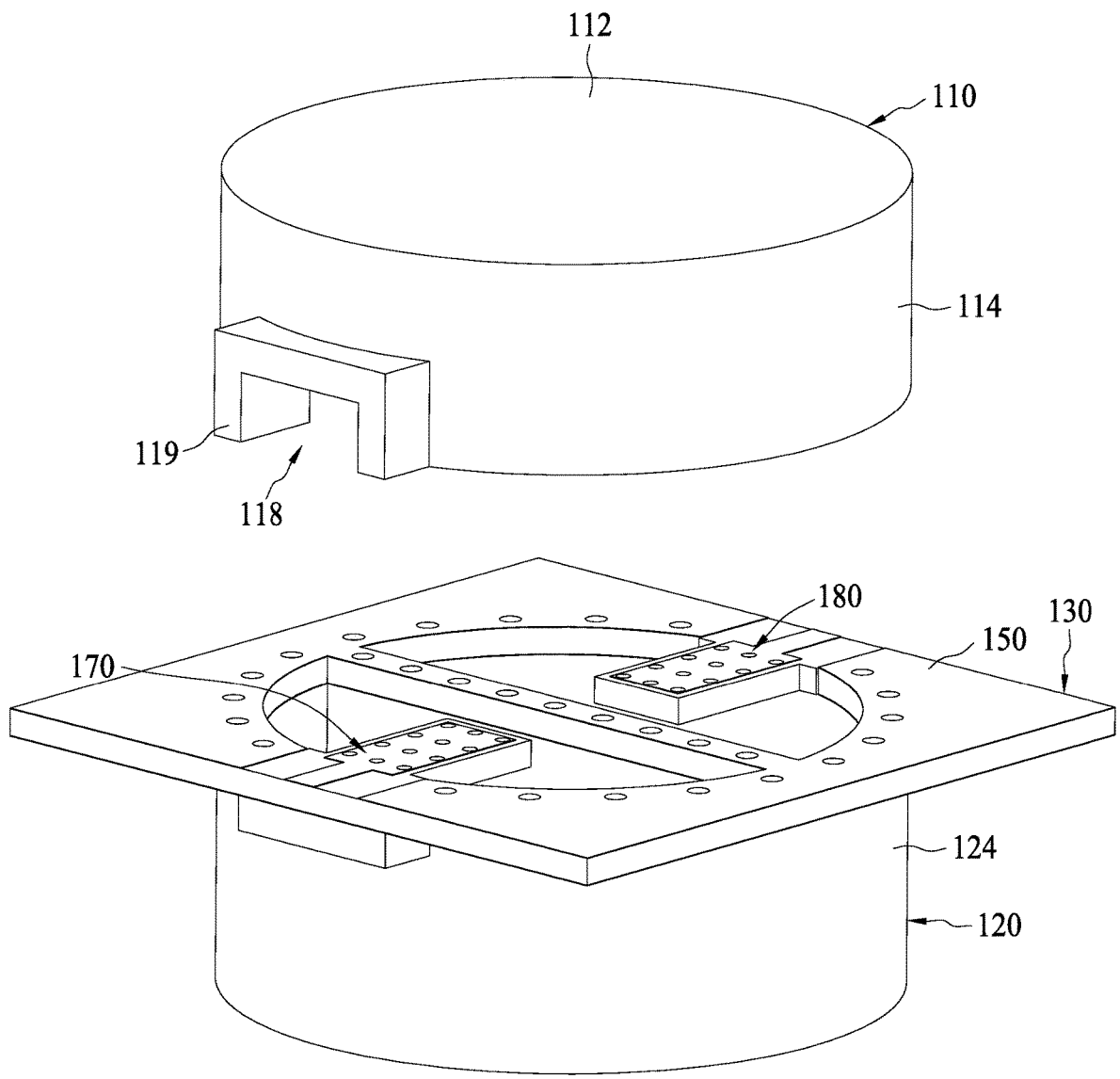
FIGS. 2 and 3 are schematic diagrams of a microwave feeding module in accordance with some embodiments of the present disclosure.
Figure 3:
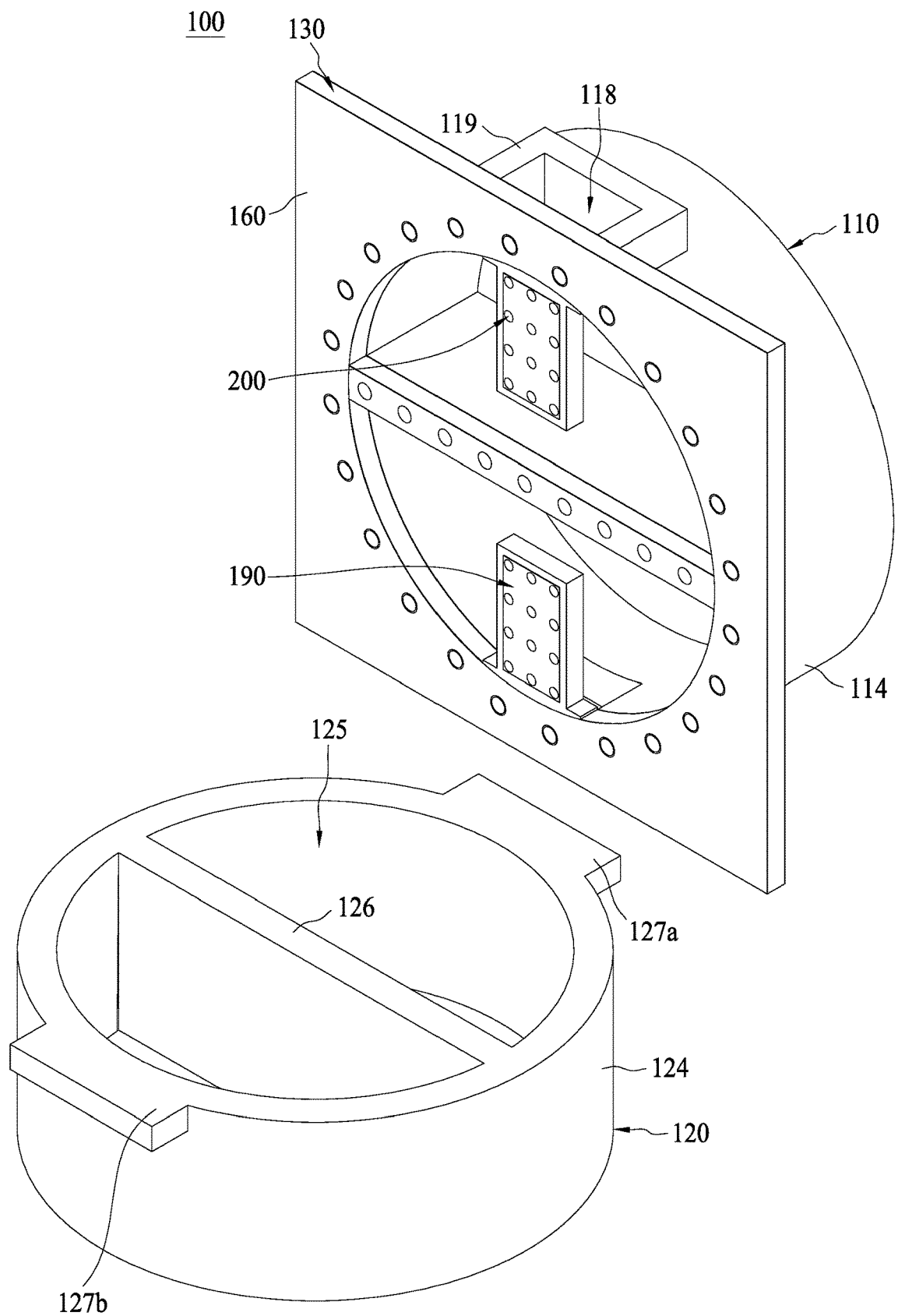
Figure 4:
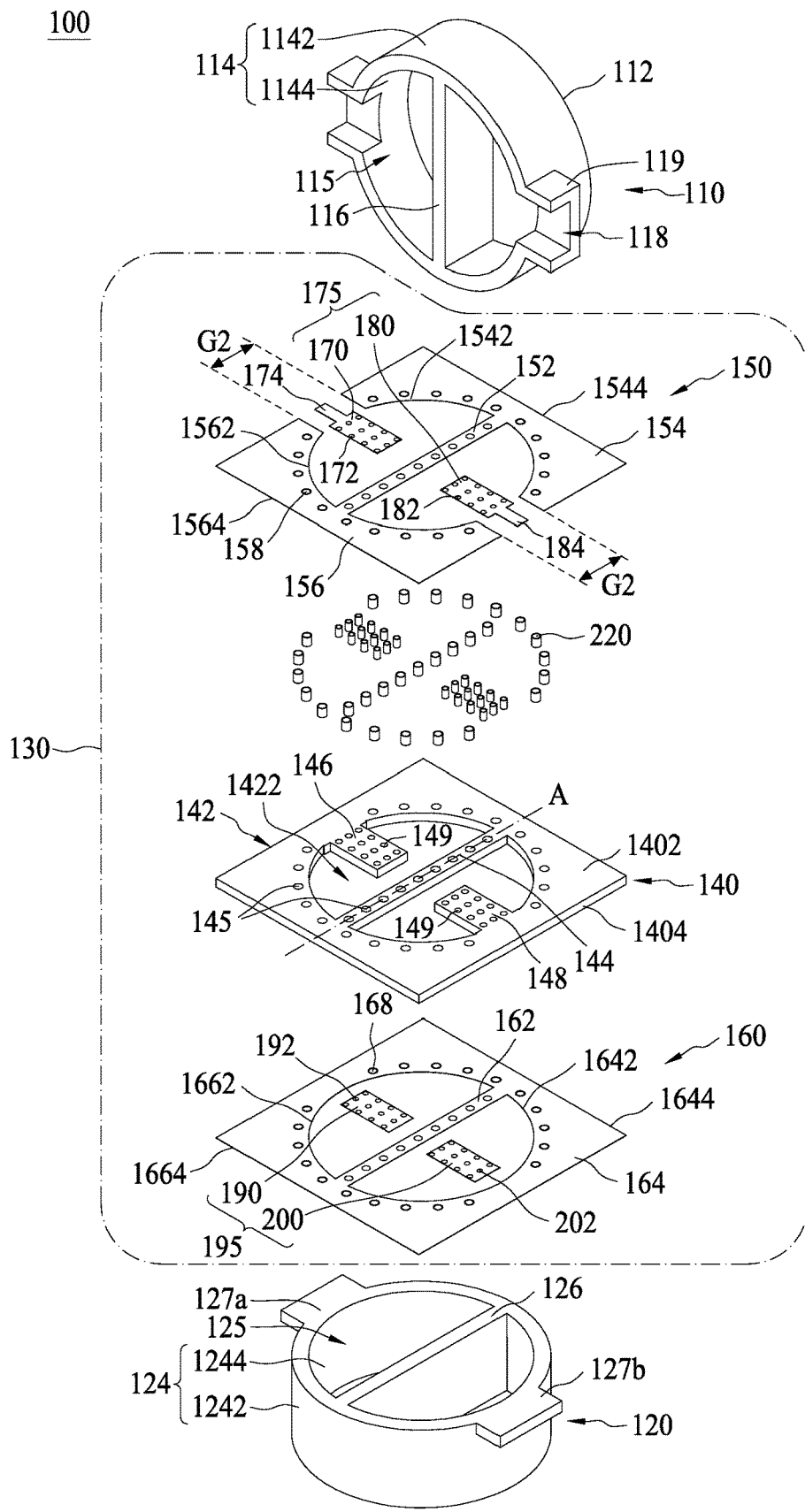
FIG. 4 is an exploded view of the microwave feeding module in accordance with some embodiments of the present disclosure.

FIGS. 2 and 3 are schematic diagrams of a microwave feeding module 100 in accordance with some embodiments of the present disclosure, and FIG. 4 is an exploded view of the microwave feeding module 100 in accordance with some embodiments of the present disclosure. Referring to FIGS. 2 to 4, in some embodiments, the microwave feeding module 100 is implemented in the LNB downconverter 14 shown in FIG. 1, and is utilized to transmit the microwave signal entering the LNB downconverter 14 to a back-stage signal processing circuit (not shown) for converting the microwave signals to the low noise IF signal. In some embodiments, the microwave feeding module 100 includes a cover 110, a waveguide 120, and a circuit board structure 130 between the cover 110 and the waveguide 120. In some embodiments, the microwave signal received by a feedhorn (not shown) of the LNB downconverter 14 may transmit through the waveguide 120, reflect by the cover 110, and receive by the feed sheets of the circuit board structure 130 will be explained below. In the context of this document, as is popular in the industry, cover 110 is also referred to as backshort and the terms should be understood to be used interchangeably unless specified otherwise.

In some embodiments, the cover 110 includes a plate 112, an annular wall 114 disposed on the peripheral portion of the plate 112, and a space 115 defined by the plate 112 and the annular wall 114. In some embodiments, the cover 110 further includes a rib 116 extending from the plate 112 and connected to the annular wall 114. In some embodiments, the annular wall 114 has an outer circumferential surface 1142, an inner circumferential surface 1144, and a plurality of notches 118 extending from the outer circumferential surface 1142 to the inner circumferential surface 1144. In some embodiments, the notches 118 are formed at locations where the rib 116 is not connected. In some embodiments, the cover 110 further includes a plurality of flanges 119 protruding from the outer circumferential surface 1142 such that each of the notches 118 is surrounded by one of the flanges 119. In some embodiments, the plate 112 has a circular shape. In some embodiments, the cover 110 is made of metal. In some embodiments, the plate 112, the annular wall 114, the rib 116, and the flange 119 may be integrally formed.

In some embodiments, the waveguide 120 has cylindrical wall 124 including an outer circumferential surface 1242 and an inner circumferential surface 1244. In some embodiments, the waveguide 120 further includes a plurality of protrusions 127a, 127b extending outward from the outer circumferential surface 1242. In some embodiments, the waveguide 120 is made of metal, and the protrusions 127a, 127b are integral with the waveguide 120.

In some embodiments, the microwave feeding module 100 further includes a septum polarizer 126 fixed in the waveguide 120 and divides an interior 125 of the waveguide 120 in half.

In some embodiments, the circuit board structure 130 comprises a dielectric substrate 140, a top grounding sheet 150, a bottom grounding sheet 160, a plurality of top feeding sheets 175, and a plurality of bottom feeding sheets 195. Referring to FIG. 4, in some embodiments, the dielectric substrate 140 includes a top surface 1402 and a bottom surface 1404 opposite to the top surface 1402. In some embodiments, a dielectric loss of the dielectric substrate 140 is greater than 0.01. In some embodiments, the dielectric loss of the dielectric substrate 140 is substantially equal to 0.02. In some embodiments, the dielectric substrate 140 is made of epoxy-glass composite material. In some embodiments, the dielectric substrate 140 is a flame retardant 4 (FR4) substrate. In some embodiments, the dielectric substrate 140 is symmetrical with respect to an axis A.

Figure 5:
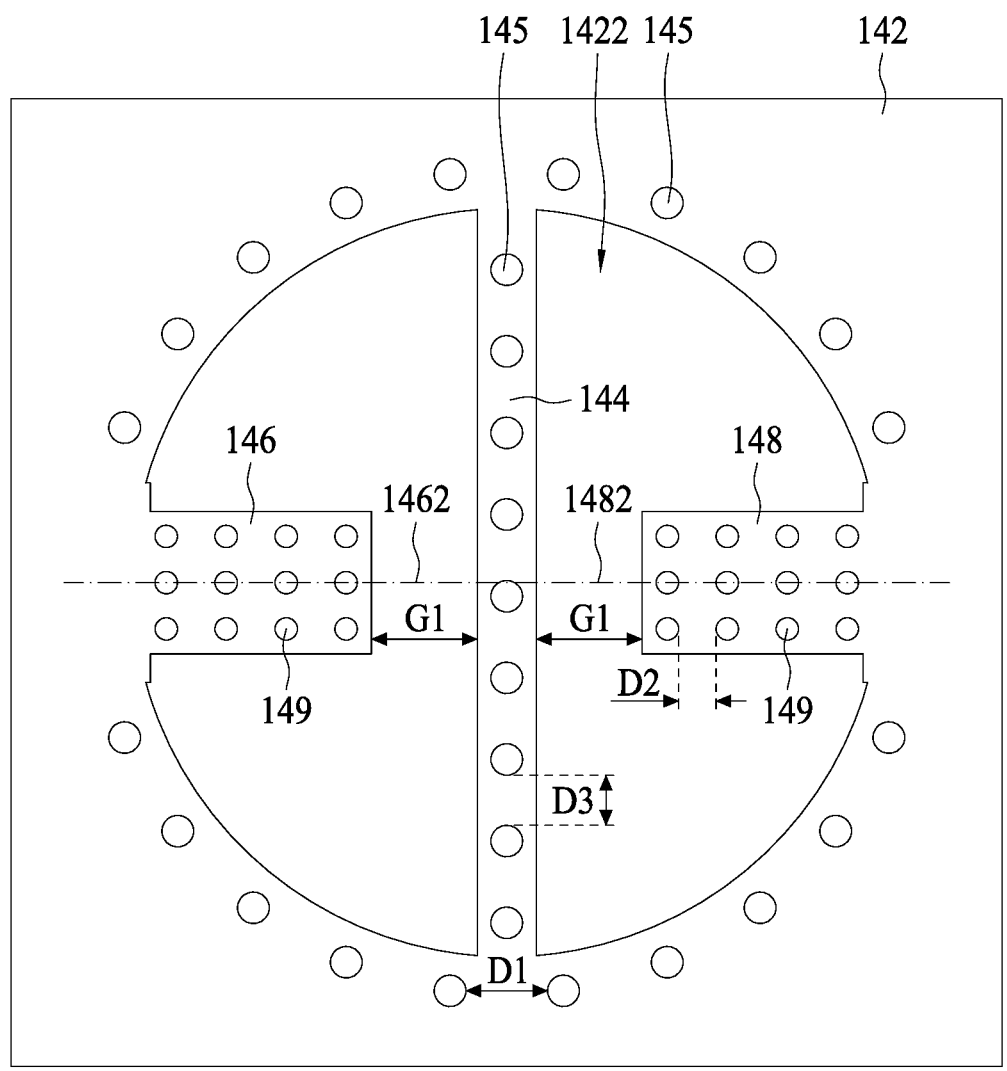
FIG. 5 is a top view of a dielectric substrate in accordance with some embodiments of the present disclosure.

FIG. 5 is a top view of the dielectric substrate 140 in accordance with some embodiments of the present disclosure.

Referring to FIG. 5, in some embodiments, the dielectric substrate 140 includes a main segment 142 having a rectangular or a square shape, a rib segment 144, a first extending segment 146, and a second extending segment 148. The main segment 142 has an opening 1422 extending from the top surface 1402 to the bottom surface 1404 shown in FIG. 4. Referring again to FIG. 5, in some embodiments, the opening 1422, arranged in a circular shape, is disposed at a center of the main segment 142. The rib segment 144 is disposed inside the opening 1422 and extends across a full width of the opening 1422.

In some embodiments, the first extending segment 146 and the second extending segment 148, formed as rectangles, extend inward from the main segment 142. In some embodiments, the first extending segment 146 and the second extending segment 148 are disposed in the opening 1422 and located at two opposite sides of the rib segment 144. In some embodiments, an extending centerline 1462 of the first extending segment 146 and an extending centerline 1482 of the second extending segment 148 are perpendicular to the rib segment 144. In some embodiments, the first extending segment 146 and the second extending segment 148 do not connect to the rib segment 144; in other words, there is a gap G1 formed between the rib segment 144 and each of the first extending segment 146 and the second extending segment 148. In some embodiments, the first extending segment 146 and the second extending segment 148 are respectively symmetric with respect to the rib segment 144.

In some embodiments, a plurality of first holes 145 are formed in the rib segment 144 and the main segment 142. In some embodiments, the first holes 145 disposed in the main segment 142 partially encircle the opening 1422. In some embodiments, the first holes 145 are disposed in locations of the main segment 142 where the first extending segment 146 and the second extending segment 148 are not connected. In some embodiments, a plurality of second holes 149, in an equal-pitch arrangement, are formed in the first extending segment 146 and the second extending segment 148. In some embodiments, a distance D1 between two adjacent first holes 145 disposed in the main segment 142 is substantially greater than a distance D2 between two adjacent second holes 149, and a distance D3 between two adjacent first holes 145 disposed on the rib segment 144 may be substantially equal to or less than the distance D1. In some embodiments, a diameter of each of the first holes 145 is greater than that of each of the second holes 149. In some embodiments, the first holes 145 and the second holes 149 are formed at the same time. In some embodiments, the first holes 145 and the second holes 149 extend from the top surface 1402 to the bottom surface 1404 shown in FIG. 4.

Referring again to FIGS. 2 to 4, in some embodiments, the top grounding sheet 150 is placed on the top surface 1402, and the bottom grounding sheet 160 is placed on the bottom surface 1404. In order to provide better performance, a total area of the top grounding sheet 150 and the bottom grounding sheet 160 should be as large as possible. In some embodiments, the top grounding sheet 150 and the bottom grounding sheet 160 are disposed over the rib segment 144 and a majority portion of the main segment 142. In some embodiments, portions of the main segment 142 where the first extending segment 146 and the second extending segment 148 are connected are exposed to the top grounding sheet 150 and the bottom grounding sheet 160.

In some embodiments, the top grounding sheet 150 comprises a top central portion 152 and two top peripheral portions 154, 156 spaced away from the central portion 152. In some embodiments, gaps G2 are formed between the top peripheral portions 154, 156. In some embodiments, a distance between two top peripheral portions 154, 156 gradually decreases at positions of increasing distance from the central portion 152. In some embodiments, the central portion 152 is placed on the rib segment 144, and the top peripheral portions 154, 156 connected to the central portion 152 are placed on the main segment 142. In some embodiments, the top peripheral portions 154, 156 have a shape that substantially corresponds to a shape of the main segment 142. In some embodiments, each of the top peripheral portions 154, 156, formed as an arch, has a curving inner edge 1542, 1562 and a straight outer edge 1544, 1564. In some embodiments, the top grounding sheet 150 further includes a plurality of through-holes 158 penetrating therethrough. In some embodiments, the through-holes 158 are circular and disposed corresponding to the first holes 145.

In some embodiments, the bottom grounding sheet 160 includes a bottom central portion 162 placed on the rib segment 144 and a bottom peripheral portion 164 placed on the main segment 142. In some embodiments, the bottom central portion 162 is connected to the bottom peripheral portion 164 and divides the interior of the bottom peripheral portion 164 in half. In some embodiments, the bottom peripheral portion 164, formed as an arch, has a circular inner edge 1642 and a straight outer edge 1644. In some embodiments, the top grounding sheet 150 and the bottom grounding sheet 160 are made of metal. In some embodiments, the bottom grounding sheet 160 further includes a plurality of through-holes 168 penetrating therethrough. In some embodiments, the through-holes 168 are circular and disposed corresponding to the first holes 145.

In some embodiments, the top feeding sheets 175 include a first feeding sheet 170 and a second feeding sheet 180 placed on the top surface 1402, wherein the top feeding sheets 175 do not come into contact with the top grounding sheet 150; the bottom feeding sheets 195 include a third feeding sheet 190 and a fourth feeding sheet 200, formed as rectangles and placed on the bottom surface 1404, wherein the bottom feeding sheets 195 do not come into contact with the bottom grounding sheet 160. In some embodiments, the first feeding sheet 170 and the third feeding sheet 190 are disposed on the first extending segment 146, and the second feeding sheet 180 and the fourth feeding sheet 200 are disposed on the second extending segment 148. In some embodiments, a plurality of through holes 172, 182, 192, 202 are respectively formed in the first feeding sheet 170, the second feeding sheet 180, the third feeding sheet 190, and the fourth feeding sheet 200. The through-holes 172, 182, 192, 202 are circular and disposed corresponding to the second holes 149.

In some embodiments, the circuit board structure 130 further includes a plurality of lead-out sheets 174, 184 extending outward from the first feeding sheet 170 and the second feeding sheet 180. In some embodiments, the lead-out sheets 174, 184 are placed on the main segment 142 where the top peripheral portions 154, 156 are not placed. In some embodiments, the lead-out sheets 174, 184 are electrically isolated from the top grounding sheet 150. In some embodiments, the first feeding sheet 170 and the lead-out sheet 174 are integrally formed, and the second feeding sheet 180 and the lead-out sheet 184 are integrally formed. In some embodiments, the first feeding sheet 170, the second feeding sheet 180, the third feeding sheet 190, the fourth feeding sheet 200, and the lead-out sheets 174, 184 are made of metal.

Figure 6:
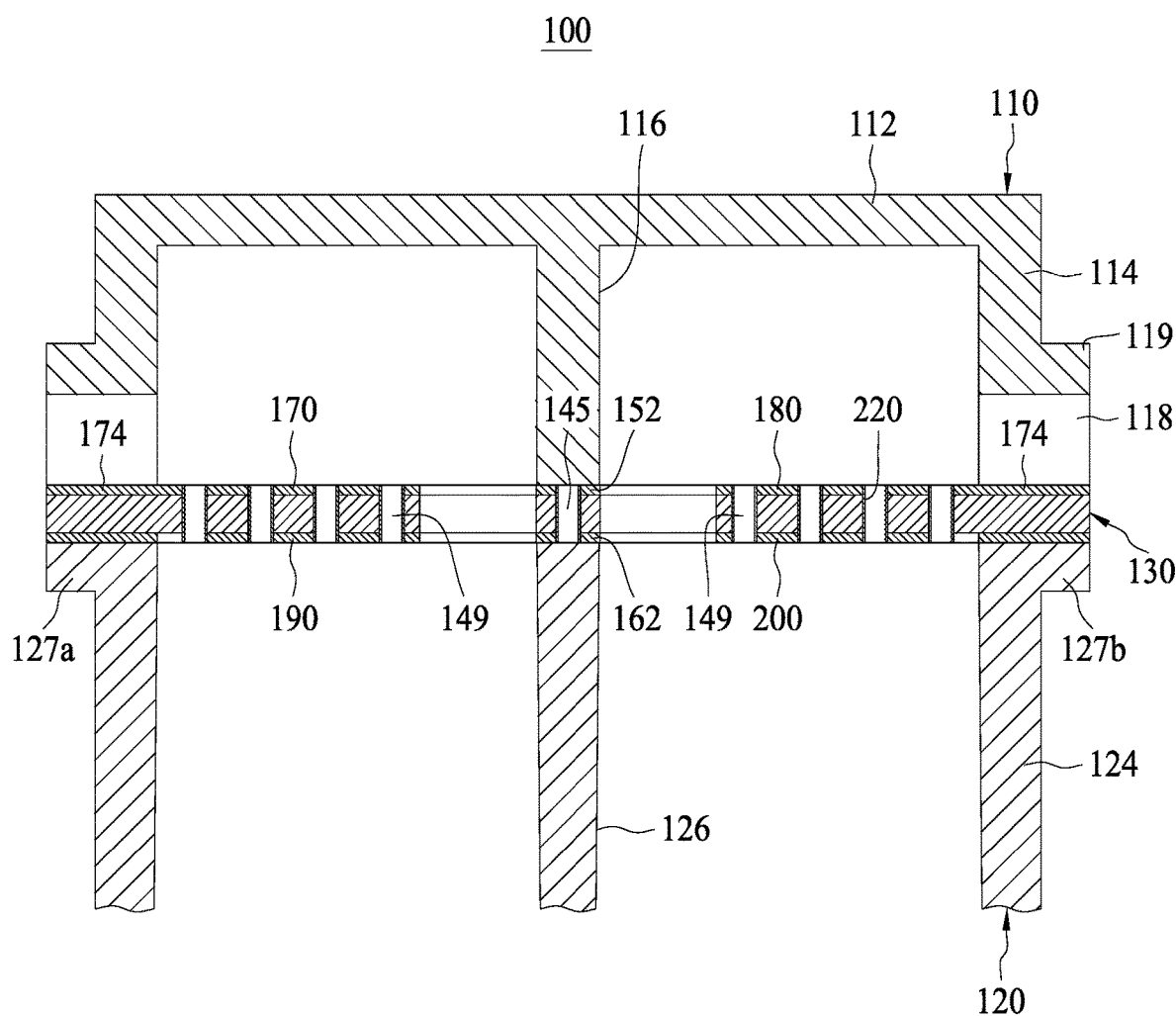
FIG. 6 is a cross-sectional view of the microwave feeding module in accordance with some embodiments of the present disclosure.

Referring to FIGS. 4 and 6, in some embodiments, the cover 110 is in contact with the top grounding sheet 150, and the waveguide 120 and the septum polarizer 126 are in contact with the bottom grounding sheet 160 after assembling. Specifically, the rib 116 is in contact with the top central portion 152, and the annular wall 114 is in contact with the top peripheral portions 154, 156; the septum polarizer 126 is in contact with the bottom central portion 162, and the waveguide 120 is in contact with the bottom peripheral portion 164. In some embodiments, a conductive layer 220 is disposed in the first holes 145, through-holes 158, 168 for electrically connecting the top grounding sheet 150 and the bottom grounding sheet 160, and the conductive layer 220 is further disposed in the second holes 149, through-holes 172, 182, 192, 202 for electrically connecting the top feeding sheets 175 and the bottom feeding sheets 195. In some embodiments, the flanges 119 are in contact with the top peripheral portions 154, 156 of the top grounding sheet 150 after assembling. In some embodiments, the protrusions 127a, 127b are disposed corresponding to the first notches 118 after assembling. In some embodiments, the protrusions 127a, 127b are in contact with the bottom peripheral portion 164 of the bottom grounding sheet 160 after assembling. In some embodiments, an insertion loss of the circuit board structure 100 made of the material with high dielectric loss is reduced since the top surface 1402 and the bottom surface 1404 thereof are provided with the grounding sheets and the feeding sheets.

Figure 7:
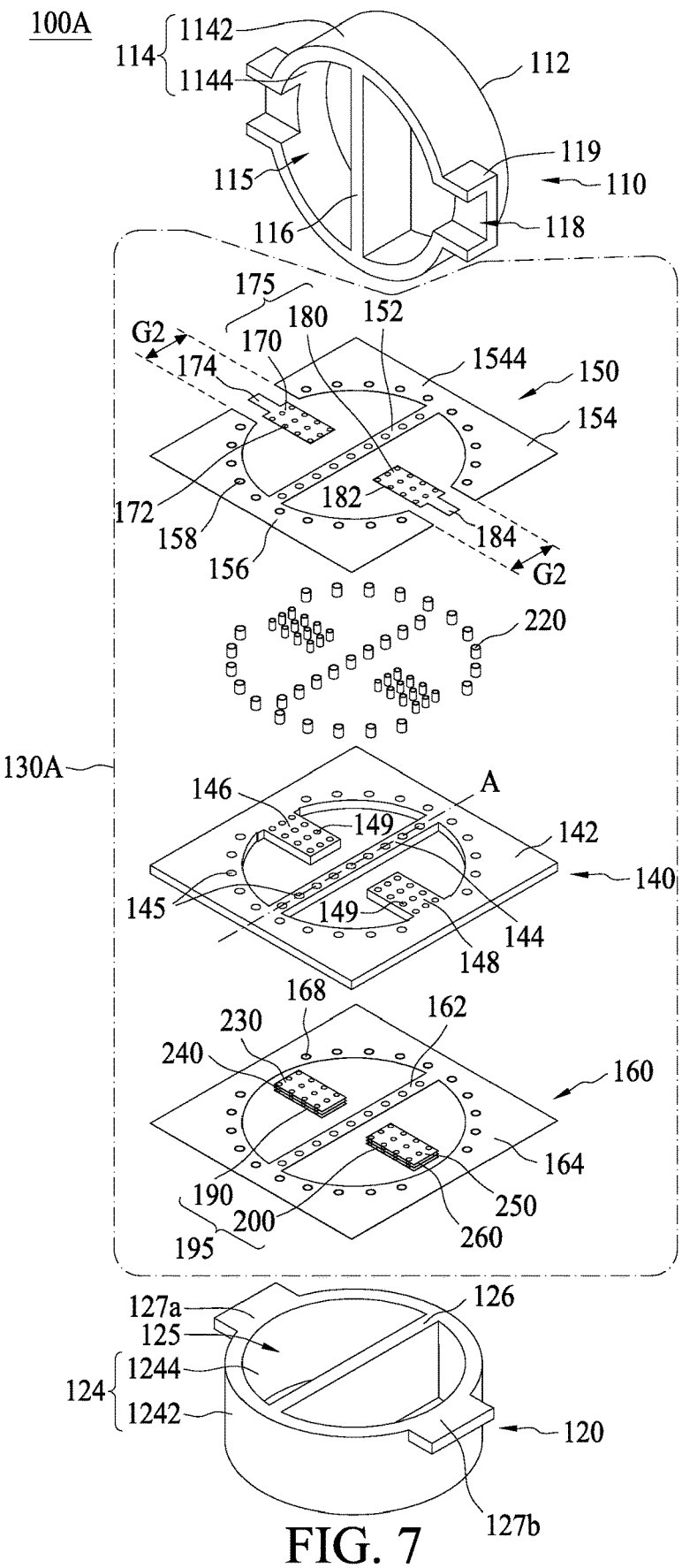
FIG. 7 is an exploded view of a microwave feeding module in accordance with some embodiments of the present disclosure.
Figure 8:
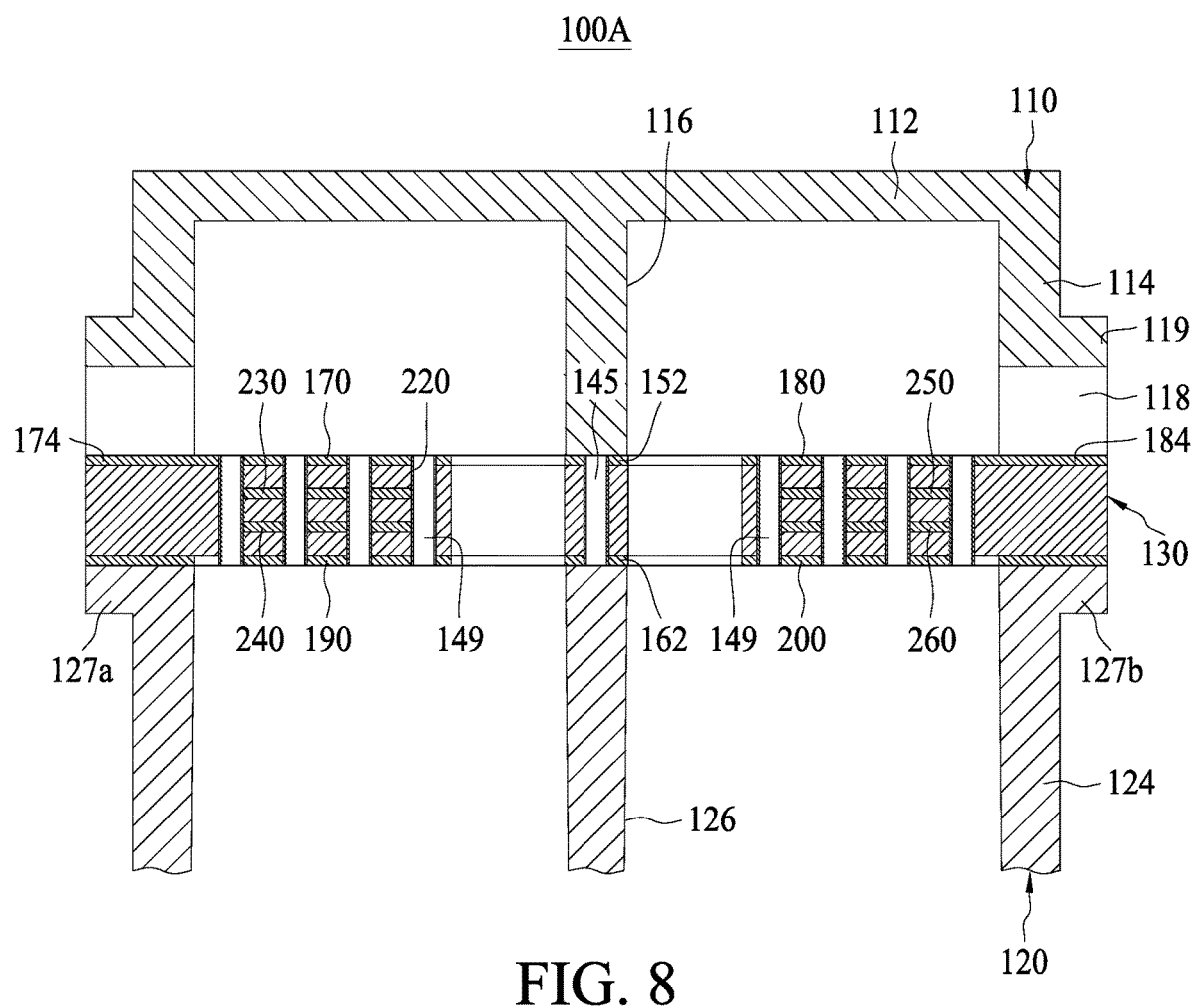
FIG. 8 is a cross-sectional view of the microwave feeding module of FIG. 7 in accordance with some embodiments of the present disclosure.

FIG. 7 is an exploded view of a microwave feeding module 100A in accordance with some embodiments of the present disclosure, and FIG. 8 is a cross-sectional view of the microwave feeding module 100A in accordance with some embodiments of the present disclosure. Unless specified otherwise, the materials and formation methods of the components in these embodiments are essentially the same as those of the like components, which are denoted by like reference numerals in the embodiments shown in FIGS. 2 through 6. The details of the like components shown in FIGS. 7 and 8 may thus be found in the discussion of the embodiments shown in FIGS. 2 through 6.

Referring to FIGS. 7 and 8, in some embodiments, the circuit board structure 130A of the feeding module 100A further includes a plurality of metal sheets 230, 240, 250, 260 disposed in the first extending segment 146 and the second extending segment 148. Specifically, the metal sheets 230 and 240 are disposed in the first extending segment 146, and the metal sheets 250 and 260 are disposed in the second extending segment 148. In some embodiments, the conductive layer 220 disposed in the second holes 149 formed in the first extending segment 146 is utilized to electrically connect the first feeding sheet 170, the third feeding sheet 190, and the metal sheets 230, 240; the conductive layer 220 disposed in the second holes 149 formed in the second extending segment 148 is utilized to electrically connect the second feeding sheet 180, the fourth feeding sheet 200, and the metal sheets 250, 260.

Figure 9:
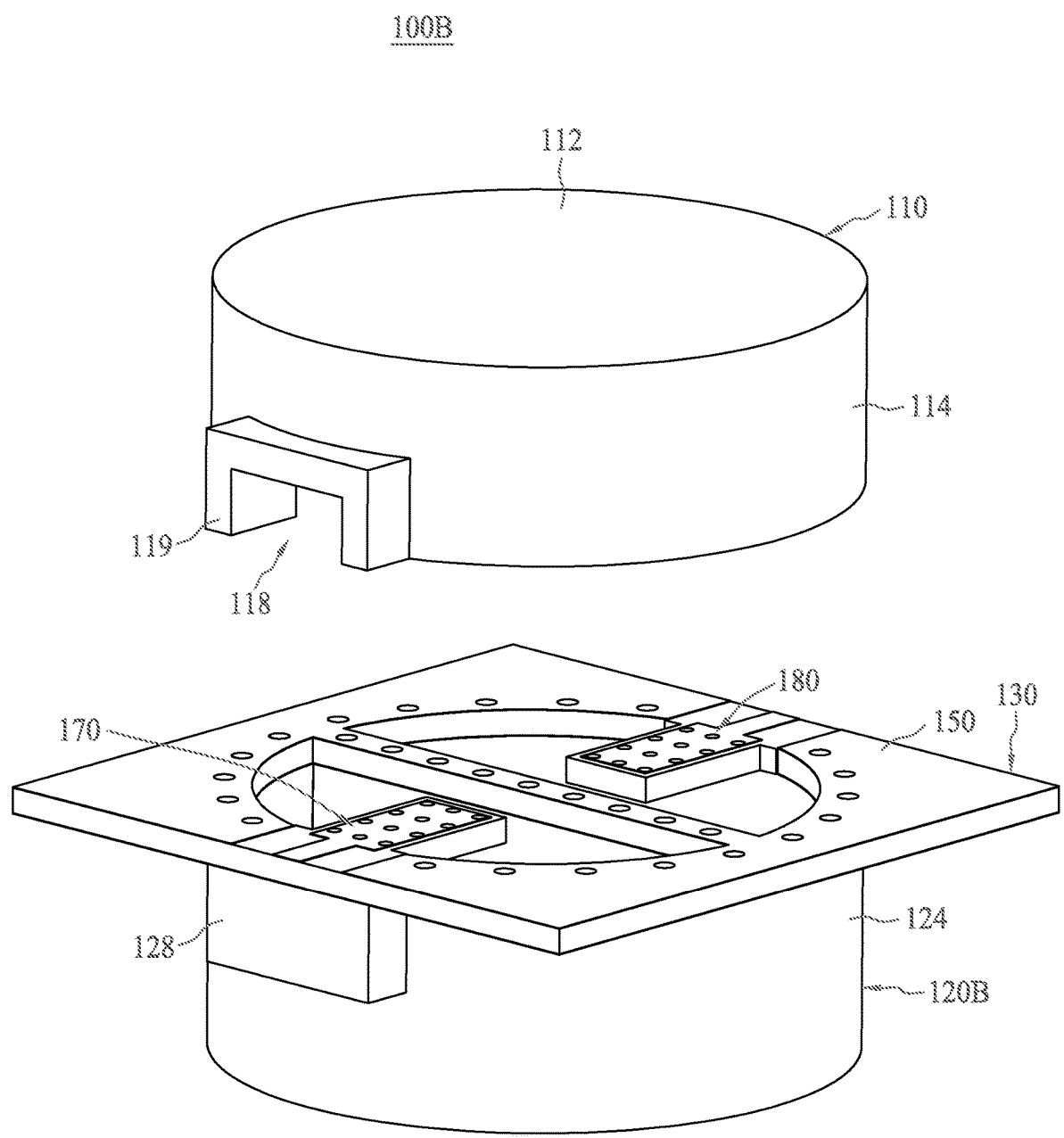
FIG. 9 is a schematic diagram of a microwave feeding module in accordance with some embodiments of the present disclosure.
Figure 10:
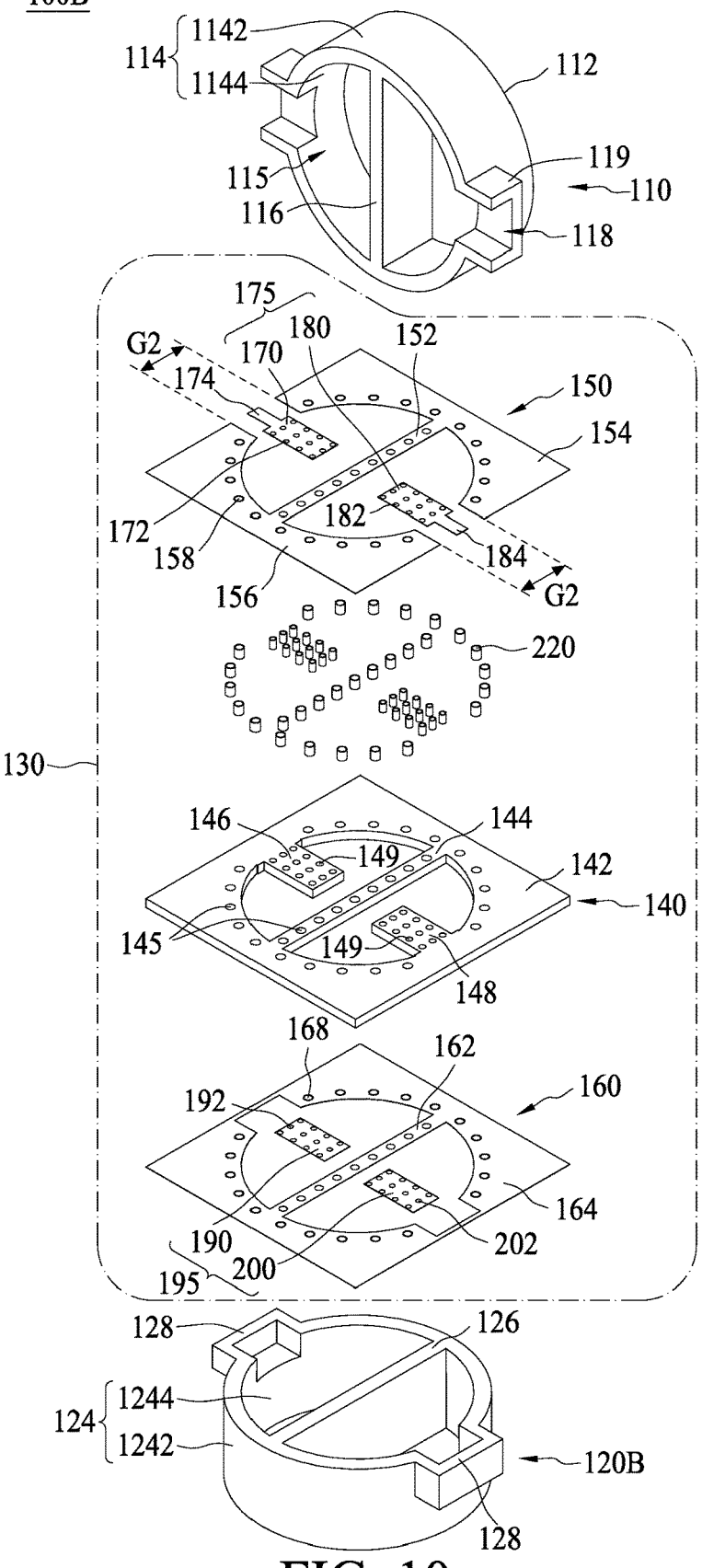
FIG. 10 is an exploded view of the microwave feeding module in accordance with some embodiments of the present disclosure.
Figure 11:
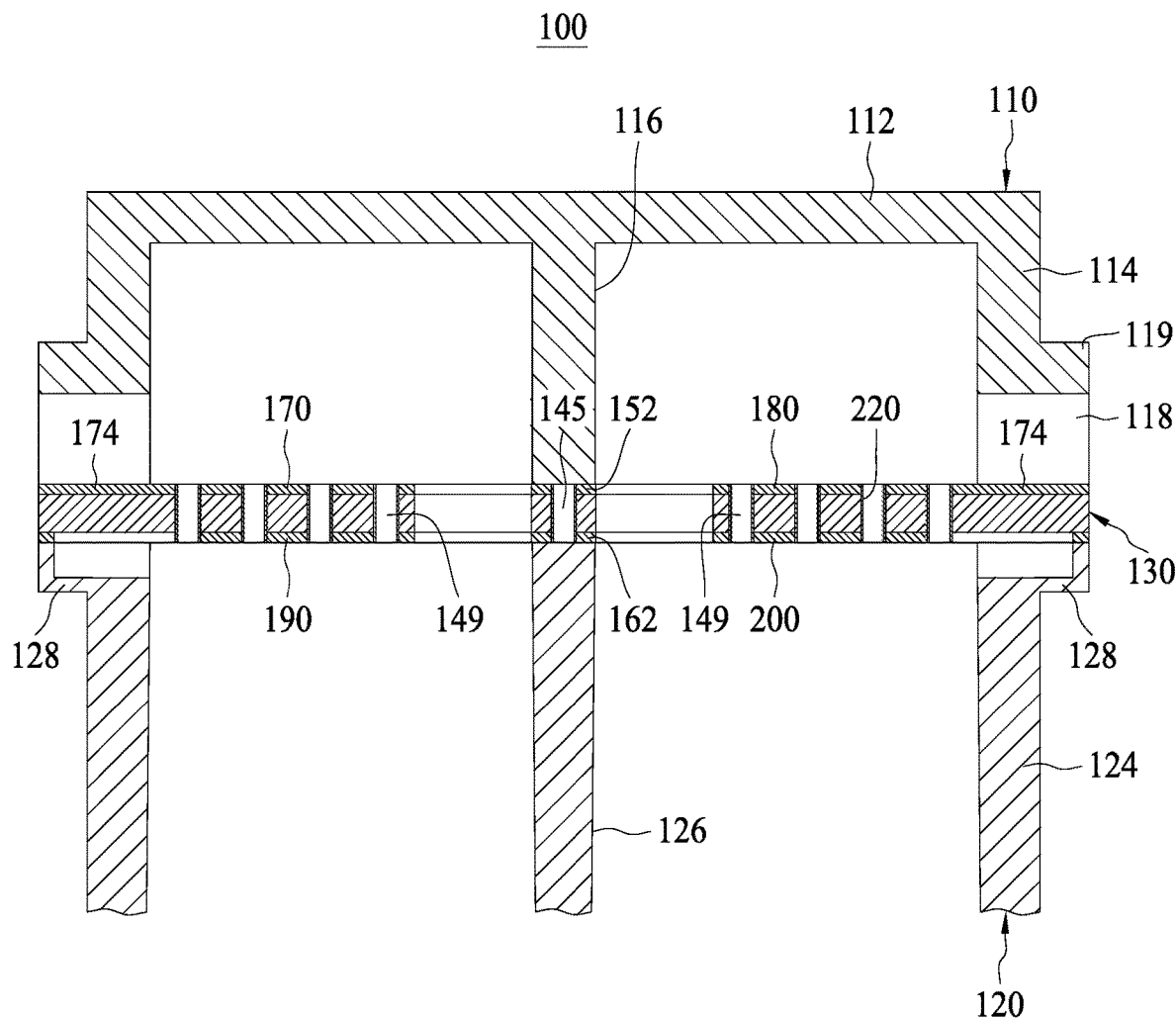
FIG. 11 is a cross-sectional view of the microwave feeding module in accordance with some embodiments of the present disclosure.

FIG. 9 is a schematic diagram of a microwave feeding module 100B in accordance with some embodiments of the present disclosure, FIG. 10 is an exploded view of the microwave feeding module 100B in accordance with some embodiments of the present disclosure, and FIG. 11 is a cross-sectional view of the microwave feeding module 10B in accordance with some embodiments of the present disclosure. Unless specified otherwise, the materials and formation methods of the components in these embodiments are essentially the same as those of the like components, which are denoted by like reference numerals in the embodiments shown in FIGS. 2 through 6. The details of the like components shown in FIGS. 9 to 11 may thus be found in the discussion of the embodiments shown in FIGS. 2 through 6.

Referring to FIGS. 9 to 11, a plurality of curved portions 128 bend outwardly form the waveguide 120B, such that an air gap stripline or suspended stripline is formed to reduce the insertion loss of the circuit board 100B. In some embodiments, the curved portions 128 are formed at locations where the septum polarizer 126 is not connected. In some embodiments, the curved portions 128 are disposed corresponding to the notches 118 after assembling.

One aspect of the present disclosure provides a circuit board structure. The circuit board includes a dielectric substrate, a plurality of grounding sheets, a plurality of feed sheets, and a conductive layer. The dielectric substrate includes a main segment having an opening, a rib segment extending across a full width of the opening, and a plurality of extending segments extending inward from the main segment. A gap is disposed between the rib segment and each of the extending segments. The grounding sheets are placed on a top surface of the dielectric substrate and a bottom surface opposite to the top surface. The grounding sheets cover the rib segment and a majority portion of the main segment. The top feeding sheets are disposed on the top surface and cover the extending segments, and the bottom sheets are disposed on the bottom surface and cover the extending segments. The top feeding sheets and the bottom feeding sheets are electrically isolated from the grounding sheets. The conductive layer is disposed in a plurality of first holes, disposed in the main segment and the rib segment, for electrically coupling the grounding sheets. The conductive layer is further disposed in a plurality of second holes, disposed in the extending segments, for electrically coupling the top feeding sheets to the bottom feeding sheets.

One aspect of the present disclosure provides a microwave feeding module. The microwave feeding module includes a cover; a waveguide, a circuit board structure between the cover and the waveguide, and a septum polarizer fixed in the waveguide. The circuit board structure includes a dielectric substrate, a plurality of grounding sheets, a plurality of top feeding sheets, a plurality of bottom feeding sheets, and a conductive layer. The dielectric substrate includes a main segment having an opening, a rib segment extending across a full width of the opening, and a plurality of extending segments extending inward from the main segment, wherein a first gap is disposed between the rib segment and each of the extending segments. The grounding sheets are placed on a top surface of the dielectric substrate and a bottom surface opposite to the top surface, and the grounding sheets cover the rib segment and a majority portion of the main segment. The cover is in contact with the grounding sheet placed on the top surface, and the waveguide is in contact with the grounding sheet placed on the bottom surface. The top feeding sheets are placed on the top surface and cover the extending segments. The bottom feeding sheets are placed on the bottom surface and cover the extending segment. The top feeding sheets and the bottom feeding sheets are electrically isolated from the grounding sheets. The conductive layer is disposed in a plurality of first holes, disposed in the main segment and the rib segment, for electrically coupling the grounding sheets; the conductive layer is further disposed in a plurality of second holes, disposed in the extending segments, for electrically coupling the top feeding sheets to the bottom feed sheets. The septum polarizer is in contact with the grounding sheet placed on the bottom surface.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit board structure, comprising:
a dielectric substrate comprising:
a main segment having an opening;
a rib segment extending across a full width of the opening; and
a plurality of extending segments extending inward from the main segment, wherein a first gap is disposed between the rib segment and each of the extending segments;
a plurality of grounding sheets placed on a top surface of the dielectric substrate and a bottom surface opposite to the top surface, wherein the plurality of grounding sheets cover the rib segment and a majority portion of the main segment;
a plurality of top feeding sheets placed on the top surface and covering the extending segments;
a plurality of bottom feeding sheets placed on the bottom surface and covering the extending segments, wherein the top feeding sheets and the bottom feeding sheets are electrically isolated from the grounding sheets; and
a conductive layer disposed in a plurality of first holes, disposed in the main segment and the rib segment, for electrically coupling the grounding sheets, and the conductive layer is further disposed in a plurality of second holes, disposed in the extending segments, for electrically coupling the top feeding sheets to the bottom feeding sheet.

2. The circuit board structure of claim 1, wherein the dielectric substrate includes a first extending segment and a second extending segment, and extending centerlines of the first extending segment and the second extending segment are respectively perpendicular to the rib segment.

3. The circuit board structure of claim 1, wherein the extending segments are respectively symmetric with respect to the rib segment.

4. The circuit board structure of claim 1, wherein a distance between two adjacent first holes of the plurality of first holes is substantially greater than a distance between two adjacent second holes of the plurality of second holes.

5. The circuit board structure of claim 1, wherein each of the grounding sheets comprises:

a central portion placed on the rib segment; and a plurality of peripheral portions placed on the main segment being spaced away from the central portion.

6. The circuit board structure of claim 5, wherein a distance between two peripheral portions of the plurality of peripheral portions gradually decreases at positions of increasing distance from the central portion.

7. The circuit board structure of claim 5, further comprising a plurality of lead-out sheets connected to the top feeding sheets and the bottom feeding sheets and placed on the main segment where the peripheral portions are not placed.

8. The circuit board structure of claim 5, wherein each of the peripheral portions has a curving inner edge and a straight outer edge.

9. The circuit board structure of claim 1, further comprising a plurality of metal sheets disposed in the dielectric substrate and electrically connected to the feeding sheets though the conductive layer disposed in the second holes.

10. The circuit board structure of claim 1, wherein a dielectric loss of the dielectric substrate is greater than 0.01.

11. The circuit board structure of claim 1, wherein a diameter of each of the first holes is greater than that of each of the second holes.

12. A microwave feeding module, comprising:

a cover;

a waveguide;

a circuit board structure between the cover and the waveguide, the circuit board structure comprising:

a dielectric substrate comprising:

a main segment having an opening;

a rib segment extending across a full width of the opening; and a plurality of extending segments extending inward from the main segment, wherein a first gap is disposed between the rib segment and each of the extending segments;

a plurality of grounding sheets placed on a top surface of the dielectric substrate and a bottom surface opposite to the top surface and covering the rib segment and a majority portion of the main segment, wherein the cover is in contact with the grounding sheet placed on the top surface, and the waveguide is in contact with the grounding sheet placed on the bottom surface;

a plurality of top feeding sheets placed on the top surface and covering the extending segments;

a plurality of bottom feeding sheets placed on the bottom surface and covering the extending segments, wherein the top feeding sheets and the bottom feeding sheets are electrically isolated from the grounding sheets; and a conductive layer disposed in a plurality of first holes, disposed in the main segment and the rib segment, for electrically coupling the grounding sheets, and the conductive layer is further disposed in a plurality of second holes, disposed in the extending segments, for electrically coupling the top feeding sheets to the bottom feeding sheet; and a septum polarizer fixed in the waveguide and in contact with the grounding sheet placed on the bottom surface.

13. The microwave feeding module of claim 12, wherein the cover comprises a plate, an annular wall disposed on the peripheral portion of the plate, and a rib extending from the plate and connected to the annular wall, the annular wall and the rib are in contact with one of the grounding sheets, and the waveguide and the septum polarizer are in contact with the other one of the grounding sheets.

14. The microwave feeding module of claim 13, wherein the cover further comprises a plurality of notches extending from an outer circumferential surface to an inner circumferential surface of the annular wall.

15. The microwave feeding module of claim 14, wherein the cover further comprises a plurality of flanges protruding from the outer circumferential surface such that each of the notches is surrounded by one of the flanges.

16. The microwave feeding module of claim 14, wherein the waveguide further comprises a plurality of protrusions extending outward from an outer circumferential surface of the waveguide, and the protrusions are disposed corresponding to the notches.

17. The microwave feeding module of claim 16, wherein the protrusions is in contact with one of the grounding sheets placed on the bottom surface.

18. The microwave feeding module of claim 14, wherein the circuit board structure further comprises a plurality of lead-out sheets connected to the top feeding sheet and the bottom feeding sheet and placed on the main segment where the peripheral portions are not placed, and the lead-out sheets are disposed in the notches.

19. The microwave feeding module of claim 14, wherein a plurality of curved portions are bend outwardly from the waveguide, and the curved portions are disposed corresponding to the notches.

20. The microwave feeding module of claim 13, wherein the septum polarizer divides an interior of the waveguide in half.

* * * * *